United States Patent
Duong et al.

(10) Patent No.: US 10,008,996 B2
(45) Date of Patent: Jun. 26, 2018

(54) VARIABLE GAIN AMPLIFIER AND METHOD OF OPERATING THE SAME

(71) Applicant: Samsung Electronics Co., Ltd., Suwon-si, Gyeonggi-do (KR)

(72) Inventors: Quochoang Duong, Seoul (KR); Yus Ko, Yongin-si (KR); Jeongwoon Kong, Seoul (KR); Hyunseok Shin, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days. days.

(21) Appl. No.: 15/602,532

(22) Filed: May 23, 2017

(65) Prior Publication Data

US 2018/0069520 A1    Mar. 8, 2018

(30) Foreign Application Priority Data

Sep. 5, 2016  (KR) .......................... 10-2016-0114004

(51) Int. Cl.
*H03F 3/45* (2006.01)
*H03G 3/30* (2006.01)
*H03G 1/00* (2006.01)

(52) U.S. Cl.
CPC ....... *H03G 3/3089* (2013.01); *H03F 3/45475* (2013.01); *H03F 3/45* (2013.01);
(Continued)

(58) Field of Classification Search
CPC .. H03G 3/3089; H03G 1/0023; H03G 1/0029; H03G 1/0035; H03G 1/0088; H03G 3/00; H03G 2201/10; H03F 3/45475; H03F 3/45; H03F 3/45183; H03F 1/34; H03F 3/45071
(Continued)

(56) References Cited

U.S. PATENT DOCUMENTS 7,026,875 B2 *   4/2006   Sobel ................. H03F 3/45192
                                                    330/282
7,102,441 B2 *   9/2006   Lee ...................... H03G 1/0088
                                                    330/254

(Continued)

FOREIGN PATENT DOCUMENTS

JP      2003087068 A      3/2003
JP      2013121033 A      6/2013

*Primary Examiner* — Khanh V Nguyen
(74) *Attorney, Agent, or Firm* — Harness, Dickey & Pierce, P.L.C.

(57) ABSTRACT

The inventive concepts relate to variable gain amplifiers. The variable gain amplifier including an amplifier, a first fixed resistor and a first variable resistor, a second fixed resistor and a second variable resistor, a third fixed resistor and a third variable resistor, a fourth fixed resistor and a fourth variable resistor, a first output terminal and a second output terminal, and a decoder may be provided. The decoder is configured to receive first control bits, generate second control bits from the first control bits, generate third and fourth control bits from the first or second control bits, respectively, transmit the first control bits and the third control bits to the third and fourth variable resistors to adjust resistance values, and transmit the second and fourth control bits to first and second variable resistors to adjust resistance values.

20 Claims, 14 Drawing Sheets

(52) U.S. Cl.
CPC ...... *H03F 3/45071* (2013.01); *H03F 3/45183* (2013.01); *H03F 2203/45022* (2013.01); *H03F 2203/45116* (2013.01); *H03G 1/0023* (2013.01); *H03G 1/0088* (2013.01)

(58) Field of Classification Search
USPC .................................................. 330/254, 260
See application file for complete search history.

(56) References Cited

U.S. PATENT DOCUMENTS

| | | | |
|---|---|---|---|
| 7,339,434 B1 | 3/2008 | Shirvani-Mahdavi et al. | |
| 7,352,238 B2 * | 4/2008 | Elwan | H03G 1/0088 330/86 |
| 7,417,499 B2 | 8/2008 | Moon et al. | |
| 7,590,393 B2 | 9/2009 | Sobel et al. | |
| 7,821,341 B2 * | 10/2010 | Kim | H03F 3/45475 330/254 |
| 8,350,623 B2 | 1/2013 | Forejt et al. | |
| 8,674,743 B1 * | 3/2014 | Tang | H03F 3/45201 330/254 |
| 8,680,920 B2 | 3/2014 | Hebert | |
| 8,744,393 B2 | 6/2014 | Mehrmanesh et al. | |
| 2013/0154738 A1 | 6/2013 | Lee | |
| 2016/0034094 A1 * | 2/2016 | Kang | G06F 3/0416 330/254 |

* cited by examiner

FIG. 4

| Control Bits (B4-B1) | Control Value (X) | R | R1 |
|---|---|---|---|
| 0000 | 0 | 0 | 15 |
| 0001 | 1 | 1 | 14 |
| 0010 | 2 | 2 | 13 |
| 0011 | 3 | 3 | 12 |
| 0100 | 4 | 4 | 11 |
| 0101 | 5 | 5 | 10 |
| 0110 | 6 | 6 | 9 |
| 0111 | 7 | 7 | 8 |
| 1000 | 8 | 8 | 7 |
| 1001 | 9 | 9 | 6 |
| 1010 | 10 | 10 | 5 |
| 1011 | 11 | 11 | 4 |
| 1100 | 12 | 12 | 3 |
| 1101 | 13 | 13 | 2 |
| 1110 | 14 | 14 | 1 |
| 1111 | 15 | 15 | 0 |

FIG. 5

| Control Value (X) | R | R1 | R0 | Av[dB] | Avi[dB] | Error[dB] |
|---|---|---|---|---|---|---|
| 0 | 0 | 15 | 0.5 | -29.82723388 | -16.28604307 | -13.54119081 |
| 1 | 1 | 14 | 0.5 | -19.70553486 | -14.11457066 | -5.590964202 |
| 2 | 2 | 13 | 0.5 | -14.6478752 | -11.94309825 | -2.704776944 |
| 3 | 3 | 12 | 0.5 | -11.05683937 | -9.771625843 | -1.28521353 |
| 4 | 4 | 11 | 0.5 | -8.149706532 | -7.600153433 | -0.549553098 |
| 5 | 5 | 10 | 0.5 | -5.616532192 | -5.428681024 | -0.187851168 |
| 6 | 6 | 9 | 0.5 | -3.296204973 | -3.257208614 | -0.038996359 |
| 7 | 7 | 8 | 0.5 | -1.087153246 | -1.085736205 | -0.001417042 |
| 8 | 8 | 7 | 0.5 | 1.087153246 | 1.085736205 | 0.001417042 |
| 9 | 9 | 6 | 0.5 | 3.296204973 | 3.257208614 | 0.038996359 |
| 10 | 10 | 5 | 0.5 | 5.616532192 | 5.428681024 | 0.187851168 |
| 11 | 11 | 4 | 0.5 | 8.149706532 | 7.600153433 | 0.549553098 |
| 12 | 12 | 3 | 0.5 | 11.05683937 | 9.771625843 | 1.28521353 |
| 13 | 13 | 2 | 0.5 | 14.6478752 | 11.94309825 | 2.704776944 |
| 14 | 14 | 1 | 0.5 | 19.70553486 | 14.11457066 | 5.590964202 |
| 15 | 15 | 0 | 0.5 | 29.82723388 | 16.28604307 | 13.54119081 |

FIG. 11

| 1st Control Bits (B[1:N]) | | | | 4th Control Bits (Sb[1:N]) | | | |
|---|---|---|---|---|---|---|---|
| B4 | B3 | B2 | B1 | Sb4 | Sb3 | Sb2 | Sb1 |
| 0 | 0 | 1 | 1 | 0 | 0 | 0 | 1 |
| 0 | 0 | 1 | 0 | 0 | 0 | 1 | 0 |
| 0 | 0 | 0 | 1 | 0 | 1 | 0 | 0 |
| 0 | 0 | 0 | 0 | 1 | 0 | 0 | 0 |

FIG. 12

| 2nd Control Bits ($\overline{B[1:N]}$) | | | | 3rd Control Bits (Sa[1:N]) | | | |
|---|---|---|---|---|---|---|---|
| $\overline{B4}$ | $\overline{B3}$ | $\overline{B2}$ | $\overline{B1}$ | Sa4 | Sa3 | Sa2 | Sa1 |
| 0 | 0 | 1 | 1 | 0 | 0 | 0 | 1 |
| 0 | 0 | 1 | 0 | 0 | 0 | 1 | 0 |
| 0 | 0 | 0 | 1 | 0 | 1 | 0 | 0 |
| 0 | 0 | 0 | 0 | 1 | 0 | 0 | 0 |

FIG. 13

| 1st Control Bits (B4-B1) | Control Value | 3rd Control Bits (Sa[1:N]) | 4th Control Bits (Sb[1:N]) | R | R1 |
|---|---|---|---|---|---|
| 0000 | 0 | 1000 | 0000 | 0 | 7 |
| 0001 | 1 | 0100 | | 1 | 10 |
| 0010 | 2 | 0010 | | 2 | 11 |
| 0011 | 3 | 0001 | | 3 | 11 |
| 0100 | 4 | 0000 | | 4 | 11 |
| 0101 | 5 | | | 5 | 10 |
| 0110 | 6 | | | 6 | 9 |
| 0111 | 7 | | | 7 | 8 |
| 1000 | 8 | | | 8 | 7 |
| 1001 | 9 | | | 9 | 6 |
| 1010 | 10 | | | 10 | 5 |
| 1011 | 11 | | | 11 | 4 |
| 1100 | 12 | | 0001 | 11 | 3 |
| 1101 | 13 | | 0010 | 11 | 2 |
| 1110 | 14 | | 0100 | 10 | 1 |
| 1111 | 15 | | 1000 | 7 | 0 |

FIG. 14

| Control Value (X) | R | R1 | R0 | Av[dB] | Avi[dB] | Error[dB] |
|---|---|---|---|---|---|---|
| 0 | 0 | 7 | 0.5 | -23.52182518 | -16.28604307 | -7.23578211 |
| 1 | 1 | 10 | 0.5 | -16.9019608 | -14.11457066 | -2.787390138 |
| 2 | 2 | 11 | 0.5 | -13.25515663 | -11.94309825 | -1.312058381 |
| 3 | 3 | 11 | 0.5 | -10.33259592 | -9.771625843 | -0.560970077 |
| 4 | 4 | 11 | 0.5 | -8.149706532 | -7.600153433 | -0.549553098 |
| 5 | 5 | 10 | 0.5 | -5.616532192 | -5.428681024 | -0.187851168 |
| 6 | 6 | 9 | 0.5 | -3.296204973 | -3.257208614 | -0.038996359 |
| 7 | 7 | 8 | 0.5 | -1.087153246 | -1.085736205 | -0.001417042 |
| 8 | 8 | 7 | 0.5 | 1.087153246 | 1.085736205 | 0.001417042 |
| 9 | 9 | 6 | 0.5 | 3.296204973 | 3.257208614 | 0.038996359 |
| 10 | 10 | 5 | 0.5 | 5.616532192 | 5.428681024 | 0.187851168 |
| 11 | 11 | 4 | 0.5 | 8.149706532 | 7.600153433 | 0.549553098 |
| 12 | 11 | 3 | 0.5 | 10.33259592 | 9.771625843 | 0.560970077 |
| 13 | 11 | 2 | 0.5 | 13.25515663 | 11.94309825 | 1.312058381 |
| 14 | 10 | 1 | 0.5 | 16.9019608 | 14.11457066 | 2.787390138 |
| 15 | 7 | 0 | 0.5 | 23.52182518 | 16.28604307 | 7.23578211 |

VARIABLE GAIN AMPLIFIER AND METHOD OF OPERATING THE SAME

CROSS-REFERENCE TO RELATED APPLICATIONS

This U.S. non-provisional patent application claims priority under 35 U.S.C. § 119 of Korean Patent Application No. 10-2016-0114004, filed on Sep. 5, 2016, the entire contents of which are hereby incorporated by reference.

BACKGROUND

The inventive concepts relate to semiconductor circuits, and more particularly, to variable gain amplifiers and/or methods of operating the same.

A variable gain amplifier is used in various industry fields. For example, a variable gain amplifier having a wide a variable gain range in decibel scale is desired in a wireless communication field such as a long term evolution (LTE). A conventional variable gain amplifier provides only a linear variable gain range of several decibels, and thus to obtain a relatively large linear variable gain range, multiple variable gain amplifiers are desired to be arranged in parallel or in series. As the linear variable gain range increases, however, this method needs more variable gain amplifiers, thereby causing an increase of cost and/or area of a device or a system using a variable gain amplifier.

Thus, variable gain amplifiers having a wider linear variable gain range than a conventional variable gain amplifier and/or methods of operating the same are demanded.

SUMMARY

According to an example embodiments of the inventive concepts, a variable gain amplifier may include an amplifier having a first input, a second input, a first output, and a second output, a first fixed resistor and a first variable resistor connected between the first input and a first input terminal, a second fixed resistor and a second variable resistor connected between the second input and a second input terminal, a third fixed resistor and a third variable resistor connected between the first input and the first output, a fourth fixed resistor and a fourth variable resistor connected between the second input and the second output, a first output terminal and a second output terminal connected to the first output and the second output respectively, and a decoder. The decoder may be configured to receive first control bits, generate second control bits from the first control bits, generate third and fourth control bits from the first or second control bits, respectively, transmit the first control bits and the third control bits to third and fourth variable resistors to adjust resistance values of the third and fourth variable resistors, and transmit the second and fourth control bits to first and second variable resistors to adjust resistance values of the first and second variable resistors.

According to an example embodiments of the inventive concepts, a method of operating a variable gain amplifier. The variable gain amplifier may include first and second input terminal, first and second output terminal, an amplifier, first through fourth variable resistors, first and fourth fixed resistors, and a decoder, the amplifier having a first input, a second input, a first output, and a second output, the first fixed resistor and the first variable resistor connected between the first input and the first input terminal, the second fixed resistor and the second variable resistor connected between the second input and the second input terminal, the third fixed resistor and the third variable resistor connected between the first input and the first output, and the fourth fixed resistor and the fourth variable resistor connected between the second input and the second output. The method of operating the variable gain amplifier may include receiving, by the decoder a first control code, generating, by the decoder, a second control code by inverting the first control code, generating, by the decoder, a third control code that changes according to the first control code, generating, by the decoder, a fourth control code that changes according to the second control code, adjusting, by the decoder, resistance values of the third and fourth variable resistors based on the first and third control codes, and adjusting, by the decoder, resistance values of the first and second variable resistors based on the second and fourth control codes.

According to an example embodiments of the inventive concepts, a variable gain amplifier may include an amplifier having a first input, a second input, a first output, and a second output, a first fixed resistor and a first variable resistor serially connected between the first input and a first input terminal, a second fixed resistor and a second variable resistor serially connected between the second input and a second input terminal, a third fixed resistor and a third variable resistor serially connected between the first input and the first output, a fourth fixed resistor and a fourth variable resistor serially connected between the second input and the second output, the first output terminal and the second output terminal connected to the first output and the second output, respectively, each of the first, second, third, and fourth variable resistors including a plurality of resistors connected in series, a plurality of first switches running in parallel with the plurality of resistors, and a second plurality of second switches running in parallel with a subset of the plurality of resistors, each of the first and second switches connected in parallel with at least one of the plurality of resistors, and a decoder configured to selectively turn-on or turn-off the first and second switches.

BRIEF DESCRIPTION OF THE DRAWINGS

Example embodiments of the inventive concepts will be described below in more detail with reference to the accompanying drawings. The example embodiments of the inventive concepts may, however, be embodied in different forms and should not be constructed as limited to the example embodiments set forth herein. Rather, these example embodiments are provided so that this disclosure will be thorough and complete, and will fully convey the scope of the inventive concepts to those skilled in the art. Like numbers refer to like elements throughout.

FIG. 4 illustrates a variation of variable resistors according to values of first control bits.

FIG. 5 illustrates resistance values of variable resistors and variable gains according to control values.

FIG. 11 illustrates fourth control bit values according to first control bit values according to an example embodiment of the inventive concepts.

FIG. 12 illustrates third control bit values according to second control bit values according to an example embodiment of the inventive concepts.

FIG. 13 illustrates a change of values of third and fourth control bits and values of variable resistors according to values of first control bits according to an example embodiment of the inventive concepts.

FIG. 14 illustrates resistance values of variable resistors and variable gains according to control values according to an example embodiment of the inventive concepts.

DETAILED DESCRIPTION

Figure 1:
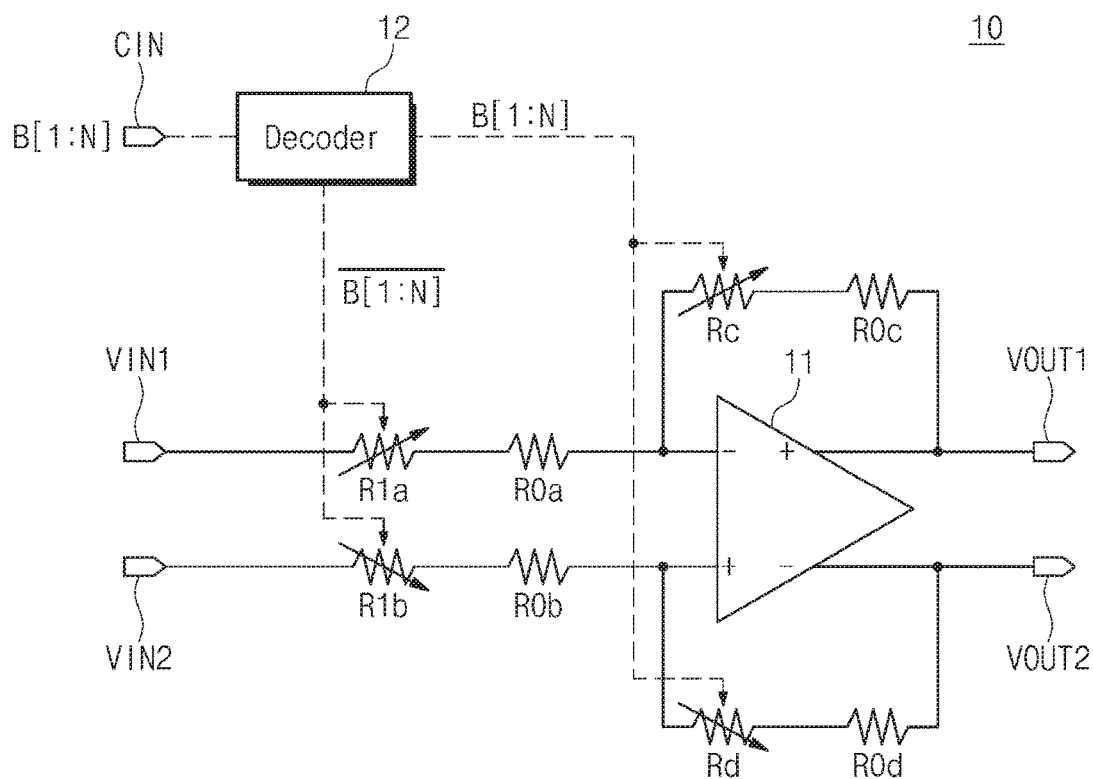
FIG. 1 illustrates a variable gain amplifier.

Inventive concepts will be described more fully hereinafter with reference to the accompanying drawings, in which some example embodiments of the inventive concepts are shown. This inventive concepts may, however, be embodied in many different forms and should not be construed as limited to the example embodiments set forth herein. Rather, these example embodiments are provided so that this disclosure will be thorough and complete, and will fully convey the scope of the inventive concepts to those skilled in the art. In the drawings, the size and relative sizes of layers and regions may be exaggerated for clarity. Like numbers refer to like elements throughout.

FIG. 1 illustrates a variable gain amplifier 10. Referring to FIG. 1, the variable amplifier 10 may include an amplifier 11, a decoder 12, first through fourth fixed (e.g., non-variable) resistors R0a to R0d (collectively, R0), first and second variable resistors R1a and R1b (collectively, R1), and third and fourth variable resistors Rc, and Rd (collectively, R).

The amplifier 11 may be an operational amplifier including differential inputs including a positive input and a negative input and differential outputs including a positive output and a negative output. The negative input of the amplifier 11 may be connected to the third variable resistor Rc and the first fixed resistor R0a. The positive input of the amplifier 11 may be connected to the fourth variable resistor Rd and the second fixed resistor R0b. The positive output of the amplifier 11 may be connected to a first output terminal VOUT1 and the third fixed resistor R0c. The negative input of the amplifier 11 may be connected to a second output terminal VOUT2 and the fourth fixed resistor R0d.

The first variable resistor R1a and the first fixed resistor R0a may be serially connected between a first input terminal VIN1 and the negative input of the amplifier 11. The third variable resistor Rc and the third fixed resistor R0c may be serially connected between the positive output and the negative input of the amplifier 11 to form a feedback loop.

The second variable resistor R1b and the second fixed resistor R0b may be serially connected between a second input terminal VIN2 and the positive input of the amplifier 11. The fourth variable resistor Rd and the fourth fixed resistor R0d may be serially connected between the negative output and the positive input of the amplifier 11 to form a feedback loop.

The first through fourth fixed resistors R0a to R0d may have the same resistance values.

The decoder 12 may receive first control bits B[1:N] through a control input terminal CIN. The decoder 12 may transmit the first control bits B[1:N] to the third and fourth variable resistors Rc and Rd to adjust resistance values of the third and fourth variable resistors Rc and Rd. For example, the decoder 12 may control the third and fourth variable resistors Rc and Rd to have the same resistance values using the first control bits B[1:N].

The decoder 12 may invert the first control bits B[1:N] to generate second control bits $\overline{B[1:N]}$. The decoder 12 may transmit the second control bits $\overline{B[1:N]}$ to the first and second variable resistors R1a and R1b to adjust resistance values of the first and second variable resistors R1a and R1b. For example, the decoder 12 may control the first and second variable resistors R1a and R1b to have the same resistance values using the second control bits $\overline{B[1:N]}$.

The variable gain amplifier 10 may amplify a difference between signals or voltages being input through the first and second input terminals VIN1 and VIN2 and output the amplified difference to the first and second output terminals VOUT1 and VOUT2. An amplification gain may be determined by resistance values of the first through fourth variable resistors R1a, R1b, Rc, and Rd adjusted by the decoder 12. For example, a gain of the variable gain amplifier 10 may be determined by a mathematical formula 1.

$$Av[dB] = 20 \times \log\left(\frac{R0 + R}{R0 + R1}\right) \quad \text{[mathematical formula 1]}$$

In the mathematical formula 1, Av indicates a gain in decibel unit (or scale) of the variable gain amplifier 10, the R0 indicates a resistance value of one or each of the fixed resistors R0a to R0d, the R1 indicates a resistance value of one or each of the first and second variable resistors R1a and R1b, and the R indicates a resistance value of one or each of the third and fourth variable resistors Rc and Rd.

Figure 2:
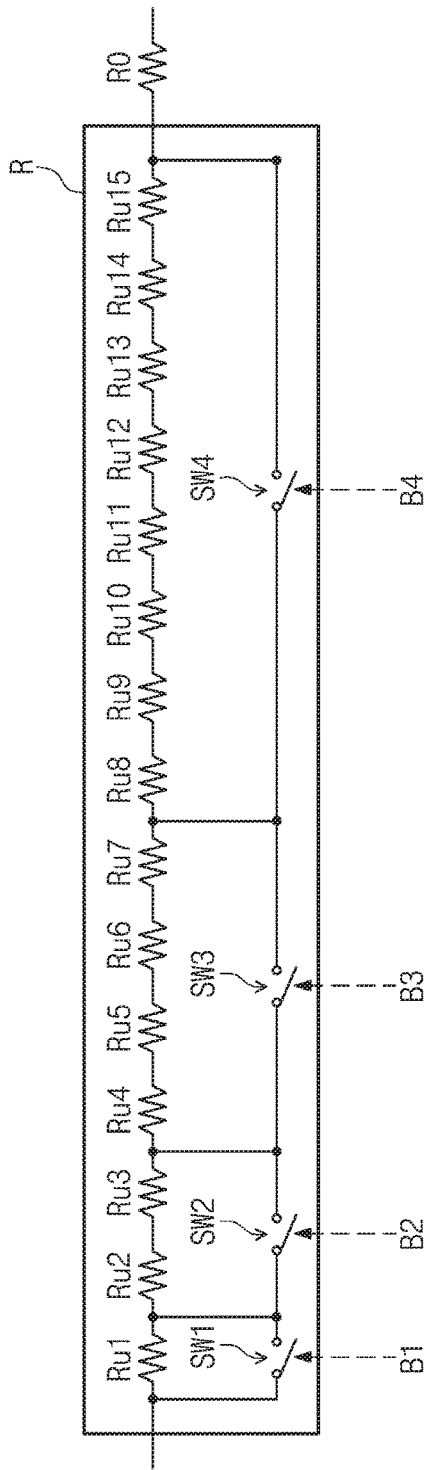
FIG. 2 illustrates one of third and fourth variable resistors.

FIG. 2 illustrates one of third and fourth variable resistors Rc and Rd. This example illustrates a case where the number N of a first control bits is 4. Referring to FIGS. 1 and 2, a variable R (e.g., the third or fourth variable resistor Rc or Rd) includes a plurality of resistors serially connected to a fixed resistor R0 (e.g., the third or fourth fixed resistor R0c or R0d). For example, the variable resistor R may include first through fifteenth resistors Ru1 to Ru15. The first through fifteenth resistors Ru1 to Ru15 may have the same resistance values.

The variable resistor R may further include first through fourth switches SW1 to SW4 connected in parallel with the first through fifteenth resistors Rut to Ru15. The first through fourth switches SW1 to SW4 may be controlled by the first control bits B[1:N]. For example, when each control bit has a value of '0', a corresponding switch may be turned on. When each control bit has a value of '1', a corresponding switch may be turned off.

The first switch SW1 may be connected in parallel with the first resistor Ru1, and may be controlled by the least significant bit (LSB) B1 of the first control bits B[1:N]. When the first switch SW1 is turned on, a parallel path for the first resistor Ru1 may be short-circuited, and thus a resistance value of the first resistor Ru1 may not be added to a resistance value of the variable resistor R.

The second switch SW2 may be connected in parallel with the second and third resistors Ru2 and Ru3, and may be controlled by a second bit B2 of the first control bits B[1:N]. When the second switch SW2 is turned on, a parallel path for the second and third resistors Ru2 and Ru3 may be short-circuited, and thus resistance values of the second and third resistors Ru2 and Ru3 may not be added to the resistance value of the variable resistor R.

The third switch SW3 may be connected in parallel with the fourth through seventh resistors Ru4 to Ru7, and may be controlled by a third bit B3 of the first control bits B[1:N]. When the third switch SW3 is turned on, a parallel path for the fourth through seventh resistors Ru4 to Ru7 may be short-circuited, and thus resistance values of the fourth through seventh resistors Ru4 to Ru7 may not be added to the resistance value of the variable resistor R.

The fourth switch SW4 may be connected in parallel with the eighth through fifteenth resistors Ru8 to Ru15, and may be controlled by the most significant bit (MSB) B4 of the first control bits B[1:N]. When the fourth switch SW4 is turned on, a parallel path for the eighth through fifteenth resistors Ru8 to Ru15 may be short-circuited, and thus resistance values of the eighth through fifteenth resistors Ru8 to Ru15 may not be added to the resistance value of the van able resistor R.

The resistance value of the variable resistor R of FIG. 2 may be expressed by a mathematical formula 2.

$$R = Ru(B1 + 2 \cdot B2 + 2^2 \cdot B3 + 2^3 \cdot B4)$$ [mathematical formula 2]

In the mathematical formula 2, Ru indicates a resistance value of each of the first through fifteenth resistors Ru1 to Ru15 when the first through fifteenth resistors Ru1 to Ru15 have a same resistance. In some example embodiments, in the mathematical formula 2, Ru of Ru1 (a resistor controlled by the first switch SW1 in response to the first bit B1), Ru of both Ru2 and Ru3 (resistors controlled by the second switch SW2 in response to the second bit B2), Ru of each of Ru4 to Ru7 (resistors controlled by the third switch SW3 in response to the third bit B3), Ru of each of Ru8 to Ru15 (resistors controlled by the second switch SW4 in response to the fourth bit B4) may have different values with each other.

Figure 3:
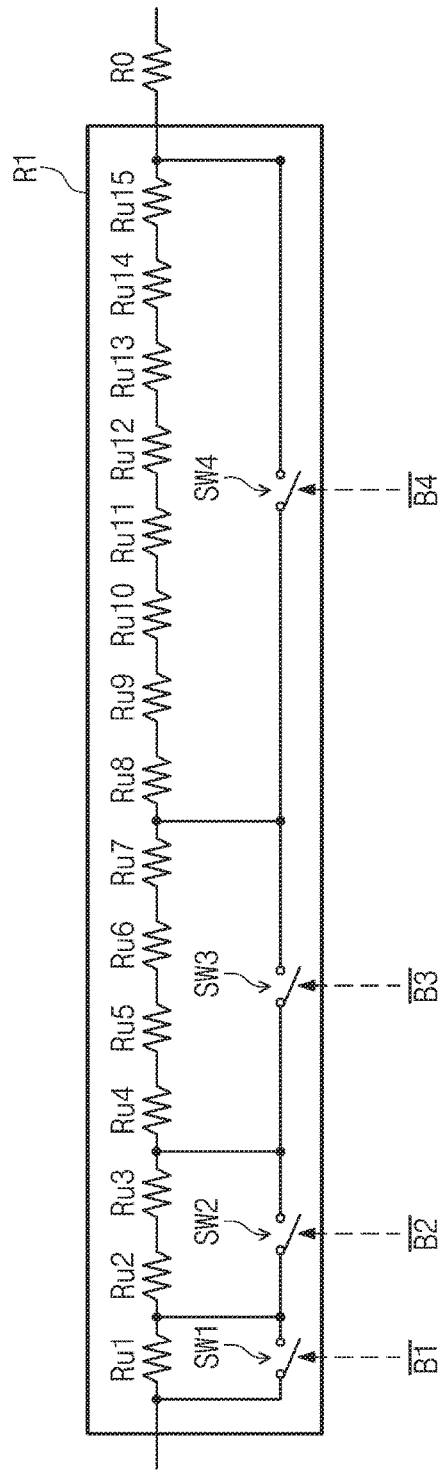
FIG. 3 illustrates one of first and second variable resistors.

FIG. 3 illustrates one of first and second variable resistors R1a and R1b. This example illustrates a case where the number N of a second control bits is 4. Referring to FIGS. 1 and 3, a variable R1 (e.g., the first or second variable resistor R1a or R1b) may include a plurality of resistors serially connected to a fixed resistor R0 (e.g., the first or second fixed resistor R0a or R0b). For example, the variable resistor RI may include first through fifteenth resistors Ru1 to Ru15. The first through fifteenth resistors Ru1 to Ru15 may have the same resistance values.

The variable resistor R1 may further include first through fourth switches SW1 to SW4. The variable resistor R1 may be controlled in the same manner of the variable resistor R of FIG. 2 except that the first through fourth switches SW1 to SW4 are controlled by the second control bits $\overline{B[1:N]}$, the second control bits $\overline{B[1:N]}$ including the least significant bit $\overline{B1}$, the second bit $\overline{B2}$, the third bit $\overline{B3}$, and the most significant bit $\overline{B4}$. Thus, an overlapping description is omitted.

A resistance value of the variable resistor R1 of FIG. 3 may be expressed by a mathematical formula 3.

$$R1 = Ru(\overline{B1} + 2 \cdot \overline{B2} + 2^2 \cdot \overline{B3} + 2^3 \cdot \overline{B4})$$ [mathematical formula 3]

FIG. 4 illustrates a variation of variable resistors R (e.g., one of Rc or Rd) and R1 (e.g., one of R1a or R1b) according to values of first control bits B[1:N]. This example illustrates a case where the number N of the first control bits is 4 and a resistance value of the resistor Ru (e.g., Ru1, Ru2, ..., Ru15) is 1.

Referring to FIGS. 1 through 4, when the first control bits B[1:N] has a value of '0000', a control value X indicated by the first control bits B[1:N] may be 0. A resistance value of the variable resistor R is 0 and a resistance value of the variable resistor R1 is 15.

As the first control bits B[1:N] increase from '0000' to '1111', the control value X may increase from 0 to 15. In this case, a resistance value of the variable resistor R may increase from 0 to 15 and a resistance value of the variable resistor R1 may decrease from 15 to 0.

FIG. 5 illustrates resistance values of variable resistors R and R1 and variable gains according to a control value X. In some example embodiments, a resistance value of the fixed resistor R0 of FIGS. 2 and 3 may be one of the first through fifteenth resistors Ru1 to Ru15, or may be half of a resistance value of each of the first through fifteenth resistors Ru1 to Ru15 as illustrated in FIG. 5.

Referring to FIG. 5, as the control value X increases, a resistance value of the variable resistor R may increase and a resistance value of the variable resistor R1 may decrease. A resistance value of the fixed resistor R0 may be maintained regardless of the control value X.

As the control value X changes, a variable gain Av[dB] of the variable gain amplifier 10 may change based on the mathematical formula 1. For example, the variable gain Av[dB] may gradually increase from a negative value to a positive value such that the negative value and the positive value are symmetric to each other. Referring to FIG. 5, the sum of the variable resistors R and R1 maintains 15. The mathematical formula 1 may be differently expressed as a mathematical formula 4 based on FIG. 5.

$$Av[dB] = 20 \text{Log}\left[\left(\frac{R + R0}{15 - R + R0}\right)\right]$$ [mathematical formula 4]

An ideal variable gain Avi[dB] indicates a gain of an ideal case where the gain has ideal linearity in decibel scale according to the control value X. To express the ideal variable gain Avi[dB], a variable t may be defined by a mathematical formula 5.

$$t = R - 7.5$$

$$R = t + 7.5$$ [mathematical formula 5]

Using the mathematical formula 5, the mathematical formula 4 may be expressed as a mathematical formula 6.

$$Av[dB] = 20 \text{Log}\left(\frac{2t}{R0 + 7.5}\right)$$ [mathematical formula 6]

From the mathematical formula 6, the ideal variable gain Avi[dB] may be approximated as follows.

$$Avi[dB] = 20 \text{Log}\left(\exp\left(\frac{2t}{R0 + 7.5}\right)\right) =$$ [mathematical formula 7]

$$20\text{Log}\left(\exp\left(\frac{2(R-7.5)}{R0+7.5}\right)\right)$$

An error Error[dB]Error[dB] indicates an error between the ideal variable gain Avi[dB] and the variable gain Av[dB] in a decibel unit.

Figure 6:
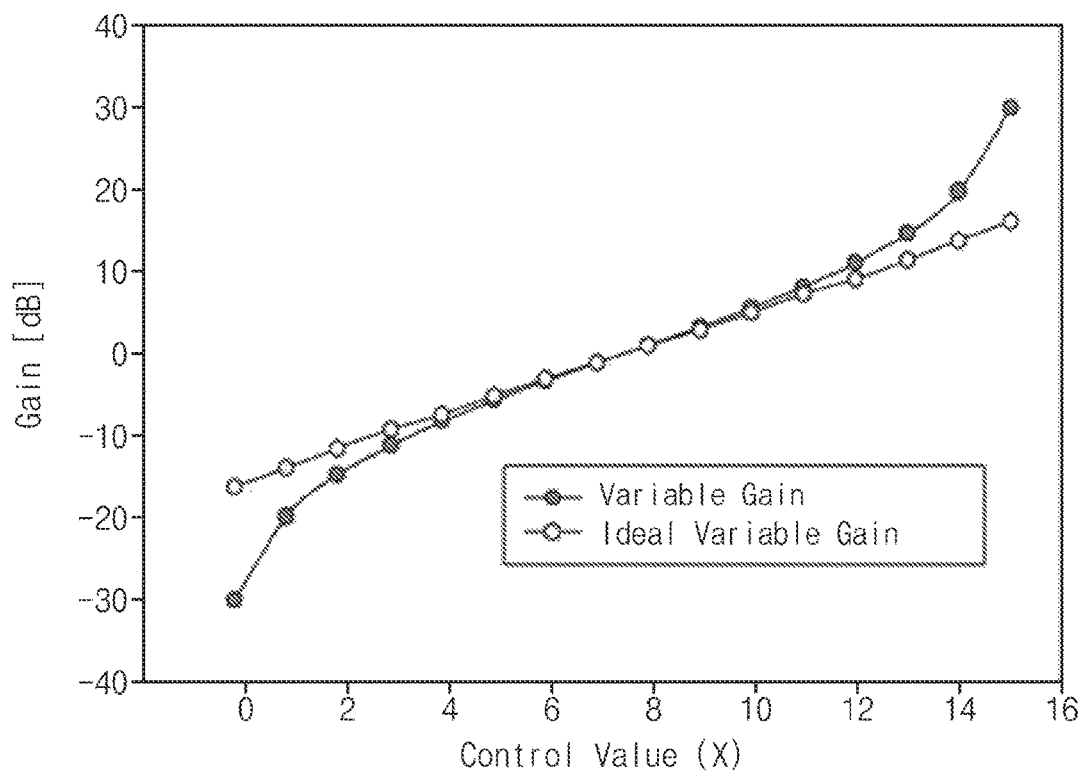
FIG. 6 illustrates a graph of a variable gain and an ideal variable gain of FIG. 5.

FIG. 6 illustrates a graph of a variable gain Av[dB] and an ideal variable gain Avi[dB] of FIG. 5. In FIG. 6, a horizontal axis indicates a control value X and a vertical axis indicates a gain. In FIG. 6, the variable gain Av[dB] and the ideal variable gain Avi[dB] with respect to the control value X are illustrated.

As illustrated in FIG. 6, as the control value X is close to a middle value, a difference between the variable gain Av[dB] and the ideal variable gain Avi[dB] is reduced. As the control value X moves away from a middle value, a difference between the variable gain Av[dB] and the ideal variable gain Avi[dB] increases. The variable gain Av[dB] has a linearity of decibel scale in the vicinity of the middle value of the control value X.

Figure 7:
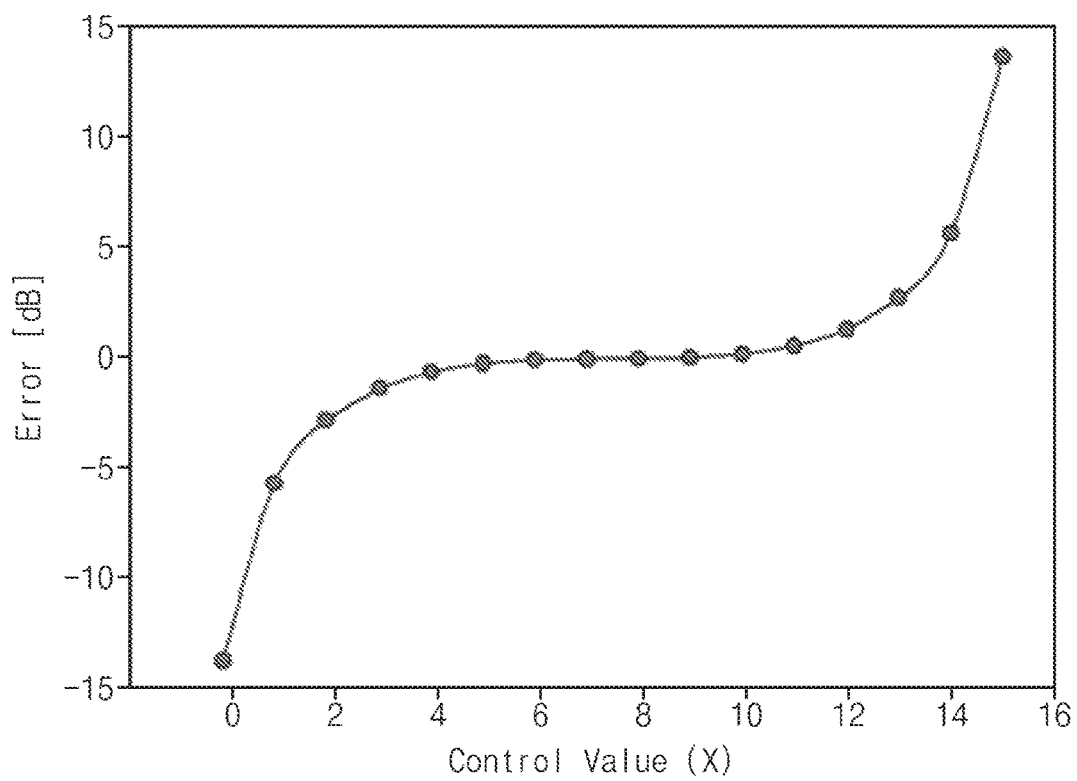
FIG. 7 illustrates a graph of an error of FIG. 5.

FIG. 7 illustrates a graph of the error Error[dB] of FIG. 5. In FIG. 7, a horizontal axis indicates the control value X and a vertical axis indicates the Error[dB].

As illustrated in FIG. 7, as the control value X is close to a middle value, the Error[dB] is reduced. As the control value X moves away from the middle value, the Error[dB] increases. As described above, the variable gain Av[dB] has a linearity of decibel scale in the vicinity of the middle value of the control value X.

As described with reference to FIGS. 6 and 7, the variable gain amplifier 10 does not have linearity over an entire range of the control value X and has a linearity only in the limited range within the control range of the control value X. Thus, in the case where a wide range of linearity is desired for a linear variable gain in a decibel unit, methods of connecting a plurality of variable gain amplifiers 10 in parallel or in series may be used. However, such methods increase cost and an area of a device or a system.

Figure 8:
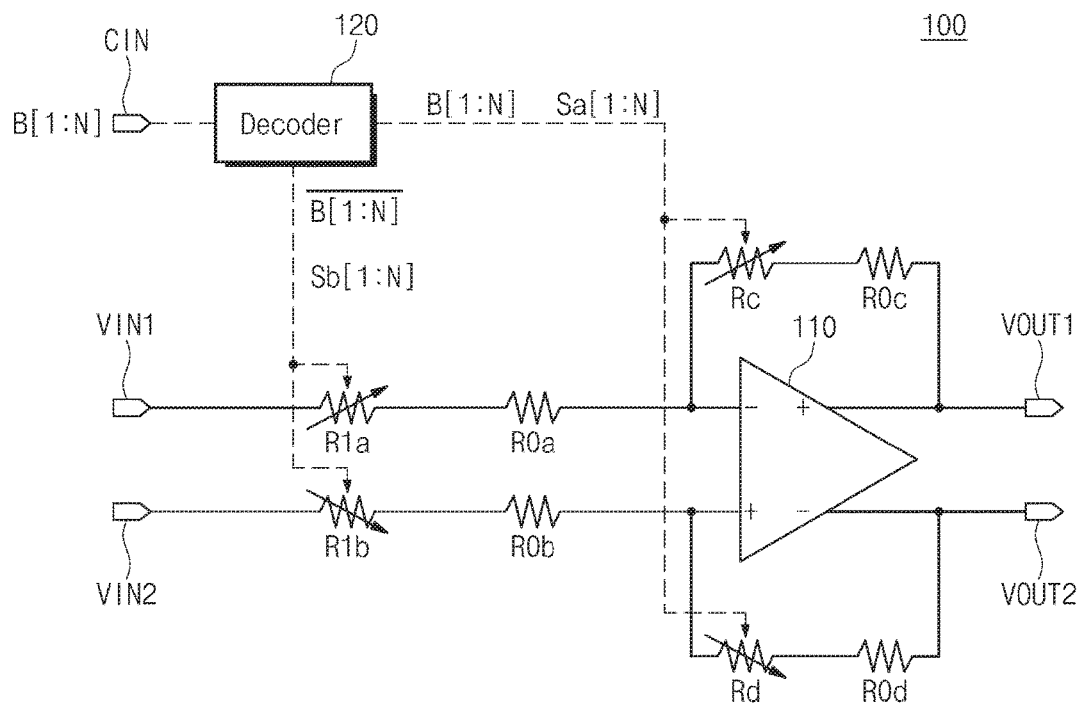
FIG. 8 illustrates a variable gain amplifier according to an example embodiment of the inventive concepts.

FIG. 8 illustrates a variable gain amplifier 100 according to an example embodiment of the inventive concepts. Referring to FIG. 8, the variable gain amplifier 100 may include an amplifier 110, a decoder 120, first through fourth fixed resistors R0a to R0d (collectively, R0), and first and second variable resistors R1a, R1b (collectively, R1), Rc, and third and fourth variable resistors Rd (collectively, R).

The amplifier 110 may be an operational amplifier including a differential input including a positive input and a negative input and a differential output including a positive output and a negative output. The negative input of the amplifier 110 may be connected to the third variable resistor Rc and the first fixed resistor R0a. The positive input of the amplifier 110 may be connected to the fourth variable resistor Rd and the second fixed resistor R0b. The positive output of the amplifier 110 may be connected to a first output terminal VOUT1 and the third fixed resistor R0c. The negative input of the amplifier 110 may be connected to a second output terminal VOUT2 and the fourth fixed resistor R0d.

The first variable resistor R1a and the first fixed resistor R0a may be serially connected between a first input terminal VIN1 and the negative input of the amplifier 110. The third variable resistor Rc and the third fixed resistor R0c may be serially connected between the positive output and the negative input of the amplifier 110 to form a feedback loop.

The second variable resistor R1b and the second fixed resistor R0b may be serially connected between a second input terminal VIN2 and the positive input of the amplifier 110. The fourth variable resistor Rd and the fourth fixed resistor R0d may be serially connected between the negative output and the positive input of the amplifier 110 to form a feedback loop.

The first through fourth fixed resistors R0a to R0d may have the same resistance values.

The decoder 120 may receive first control bits B[1:N] through a control input terminal CIN. The decoder 120 may generate third control bits Sa[1:N] from the first control bits B[1:N]. The decoder 120 may transmit the first control bits B[1:N] and the third control bits Sa[1:N] to the third and fourth variable resistors Rc and Rd to adjust resistance values of the third and fourth variable resistors Rc and Rd. For example, the decoder 120 may control the third and fourth variable resistors Rc and Rd to have the same resistance values using the first control bits B[1:N] and the third control bits Sa[1:N]

The decoder 120 may invert the first control bits B[1:N] to generate second control bits $\overline{B[1:N]}$. The decoder 120 may generate fourth control bits Sb[1:N] from the second control bits $\overline{B[1:N]}$. The decoder 120 may transmit the second control bits $\overline{B[1:N]}$ and the fourth control bits Sb[1:N] to the first and second variable resistors R1a and R1b to adjust resistance values of the first and second variable resistors R1a and R1b. For example, the decoder 120 may control the first and second variable resistors R1a and R1b to have the same resistance values using the second control bits $\overline{B[1:N]}$ and the fourth control bits Sb[1:N]. Each of the first control bits B[1:N], the second control bits $\overline{B[1:N]}$, the third control bits Sa[1:N] and the fourth control bits Sb[1:N] may include N number of bits.

The variable gain amplifier 100 may amplify a difference between signals or voltages being input through the first and second input terminals VIN1 and VIN2 and output the amplified difference to the first and second output terminals VOUT1 and VOUT2. An amplification gain may be determined by resistance values of the first through fourth variable resistors R1a, R1b, Rc, and Rd adjusted by the decoder 120. For example, a gain of the variable gain amplifier 100 may be determined by the mathematical formula 1.

Figure 9:
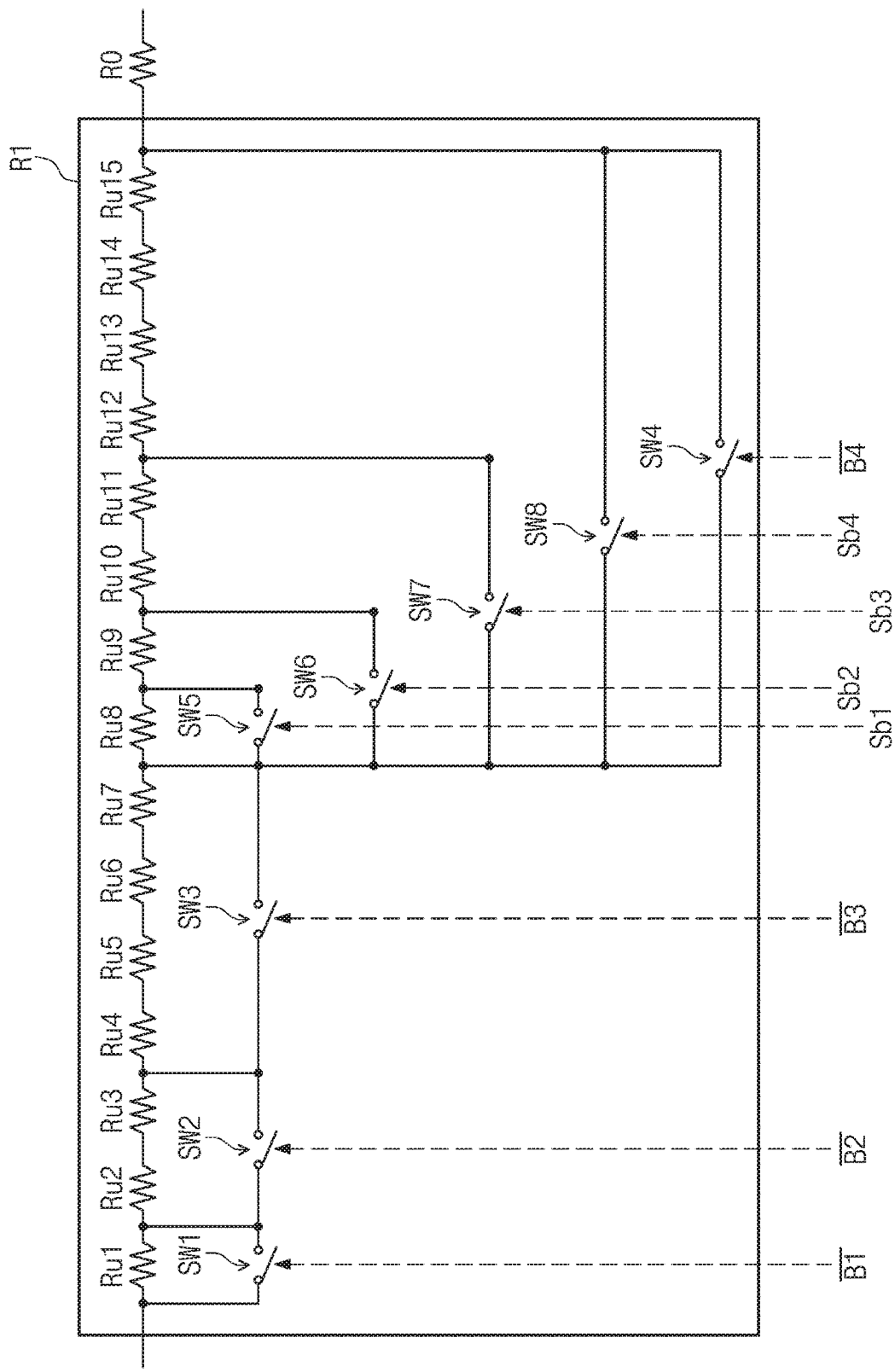
FIG. 9 illustrates one of a first variable resistor and a second variable resistor according to an example embodiment of the inventive concepts.

FIG. 9 illustrates one of a first variable resistor R1a and a second variable resistor R1b according to an example embodiment of the inventive concepts. An example where N is 4 is illustrated in FIG. 9. Referring to FIGS. 8 and 9, a variable (e.g., the first or second variable resistor R1a or R1b) includes a plurality of resistors serially connected to a fixed resistor R0 (e.g., the first or second fixed resistor R0a or R0b). For example, the variable resistor R1 includes first through fifteenth resistors Ru1 to Ru15. The first through fifteenth resistors Ru1 to Ru15 may have the same resistance values.

The variable resistor R1 further includes first through fourth switches SW1 to SW4 connected in parallel with the first through fifteenth resistors Ru1 to Ru15. The first through fourth switches SW1 to SW4 may be controlled by the second control bits $\overline{B[1:N]}$. For example, when each control bit has a value of '1', a corresponding switch may be turned on. When each control bit has a value of '0', a corresponding switch may be turned off.

The first switch SW1 may be connected in parallel with the first resistor Ru1, and may be controlled by the least significant bit (LSB) $\overline{B1}$ of the second control bits $\overline{B[1:N]}$. When the first switch SW1 is turned on, a parallel path for the first resistor Ru1 may be short-circuited, and a resistance value of the first resistor Ru1 may not be added to a resistance value of the variable resistor R1.

The second switch SW2 may be connected in parallel with the second and third resistors Ru2 and Ru3, and may be controlled by a second bit $\overline{B2}$ of the second control bits $\overline{B[1:N]}$. When the second switch SW2 is turned on, a parallel path for the second and third resistors Ru2 and Ru3 may be short-circuited, and resistance values of the second and third resistors Ru2 and Ru3 may not be added to the resistance value of the variable resistor R1.

The third switch SW3 may be connected in parallel with the fourth through seventh resistors Ru4 to Ru7, and may be controlled by a third bit $\overline{B3}$ of the second control bits $\overline{B[1:N]}$ When the third switch SW3 is turned on, a parallel path for the fourth through seventh resistors Ru4 to Ru7 may be short-circuited, and resistance values of the fourth through seventh resistors Ru4 to Ru7 may not be added to the resistance value of the variable resistor R1.

The fourth switch SW4 may be connected in parallel with the eighth through fifteenth resistors Ru8 to Ru15, and may be controlled by the most significant bit (MSB) $\overline{B4}$ of the second control bits $\overline{B[1:N]}$. When the fourth switch SW4 is turned on, a parallel path for the eighth through fifteenth resistors Ru8 to Ru15 may be short-circuited, and resistance values of the eighth through fifteenth resistors Ru8 to Ru15 may not be added to the resistance value of the variable resistor R1.

The variable resistor R1 further includes fifth to eighth switches SW5 to SW8 connected in parallel with the eighth to fifteenth resistors Ru8 to Ru15. The fifth to eighth switches SW5 to SW8 may be controlled by the fourth control bits Sb[1:N]. For example, when each control bit has a value of '1', a corresponding switch may be turned on. When each control bit has a value of '0', a corresponding switch may be turned off.

The fifth switch SW5 may be connected in parallel with the eighth resistor Ru8, and may be controlled by the least significant bit (LSB) Sb1 of the fourth control bits Sb[1:N]. When the fifth switch SW5 is turned on, a parallel path for the eighth resistor Ru8 may be short-circuited, and a resistance value of the eighth resistor Ru8 may not be added to a resistance value of the variable resistor R1. A value of the least significant bit Sb1 of the fourth control bits Sb[1:N] may be expressed by a logical AND of values of the least significant bit $\overline{B3}$ and a second bit B2 of the first control bits B[1:N], and values of a third bit $\overline{B3}$ and the most significant bit $\overline{B4}$ of the second control bits $\overline{B[1:N]}$ The sixth switch SW6 may be connected in parallel with the eighth and ninth resistors Ru8 and Ru9, and may be controlled by a second bit Sb2 of the fourth control bits Sb[1:N]. When the sixth switch SW6 is turned on, a parallel path for the eighth and ninth resistors Ru8 and Ru9 may be short-circuited, and a resistance value of the eighth and ninth resistors Ru8 and Ru9 may not be added to a resistance value of the variable resistor R1. A value of the second bit Sb2 of the fourth control bits Sb[1:N] may be expressed by a logical AND of a value of the second bit B2 of the first control bits B[1:N], and values of the least significant bit $\overline{B1}$, the third bit $\overline{B3}$ and the most significant bit B4 of the second control bits $\overline{B[1:N]}$.

The seventh switch SW7 may be connected in parallel with the eighth through eleventh resistors Ru8 to Ru11, and may be controlled by a third bit Sb3 of the fourth control bits Sb[1:N]. When the seventh switch SW7 is turned on, a parallel path for the eighth through eleventh resistors Ru8 to Ru11 may be short-circuited, and a resistance value of the eighth through eleventh resistors Ru8 to Ru11 may not be added to a resistance value of the variable resistor R1. A value of the third bit Sb3 of the fourth control bits Sb[1:N] may be expressed by a logical AND of a value of the least significant bit B1 of the first control bits B[1:N], and values of a second bit $\overline{B2}$, the third bit $\overline{B3}$ and the most significant bit $\overline{B4}$ of the second control bits $\overline{B[1:N]}$.

The eighth switch SW8 may be connected in parallel with the eighth through fifteenth resistors Ru8 to Ru15, and may be controlled by the most significant bit (MSB) Sb4 of the fourth control bits Sb[1:N]. When the eighth switch SW8 is turned on, a parallel path for the eighth through fifteenth resistors Ru8 to Ru15 may be short-circuited, and a resistance value of the eighth through fifteenth resistors Ru8 to Ru15 may not be added to a resistance value of the variable resistor R1. A value of the most significant bit (MSB) Sb4 of the fourth control bits Sb[1:N] may be expressed by a logical AND of values of the least significant bit $\overline{B1}$, the second bit $\overline{B2}$, the third bit $\overline{B3}$, and the most significant bit $\overline{B4}$ of the second control bits $\overline{B[1:N]}$.

The resistance value of the variable resistor R1 of FIG. 9 may be expressed by a mathematical formula 8.

$$R1 = Ru[\overline{B1} + 2\overline{B2} + 2^2\overline{B3} + \overline{B4}(2^3 - \{Sb1 + 2Sb2 + 2^2Sb3 + 2^3Sb4\})] \quad \text{[mathematical formula 8]}$$

As described with reference to FIG. 9, the second control bits $\overline{B[1:N]}$ may be supplied to the first through fourth switches SW1 to SW4 connected in parallel with the first through fifteenth resistors Ru1 to Ru15. Each of the first through fourth switches SW1 to SW4 may be connected in parallel with the $2^{k-1}$ (k is an order of a corresponding bit among the first control bits B[1:N]) number of resistors among the first through fifteenth resistors Ru1 to Ru15. The first through fourth switches SW1 to SW4 may be connected to different resistors respectively.

Each of the fourth control bits Sb[1:N] may be supplied to the fifth through eighth switches SW5 to SW8 connected in parallel with the eighth through fifteenth resistors Ru8 to Ru15. Each of the fifth through eighth switches SW5 to SW8 is connected in parallel with the $2^{k-1}$ (k is an order of a corresponding bit among the third control bits Sa[1:N]) number of resistors among the eighth through fifteenth resistors Ru8 to Ru15.

Figure 10:
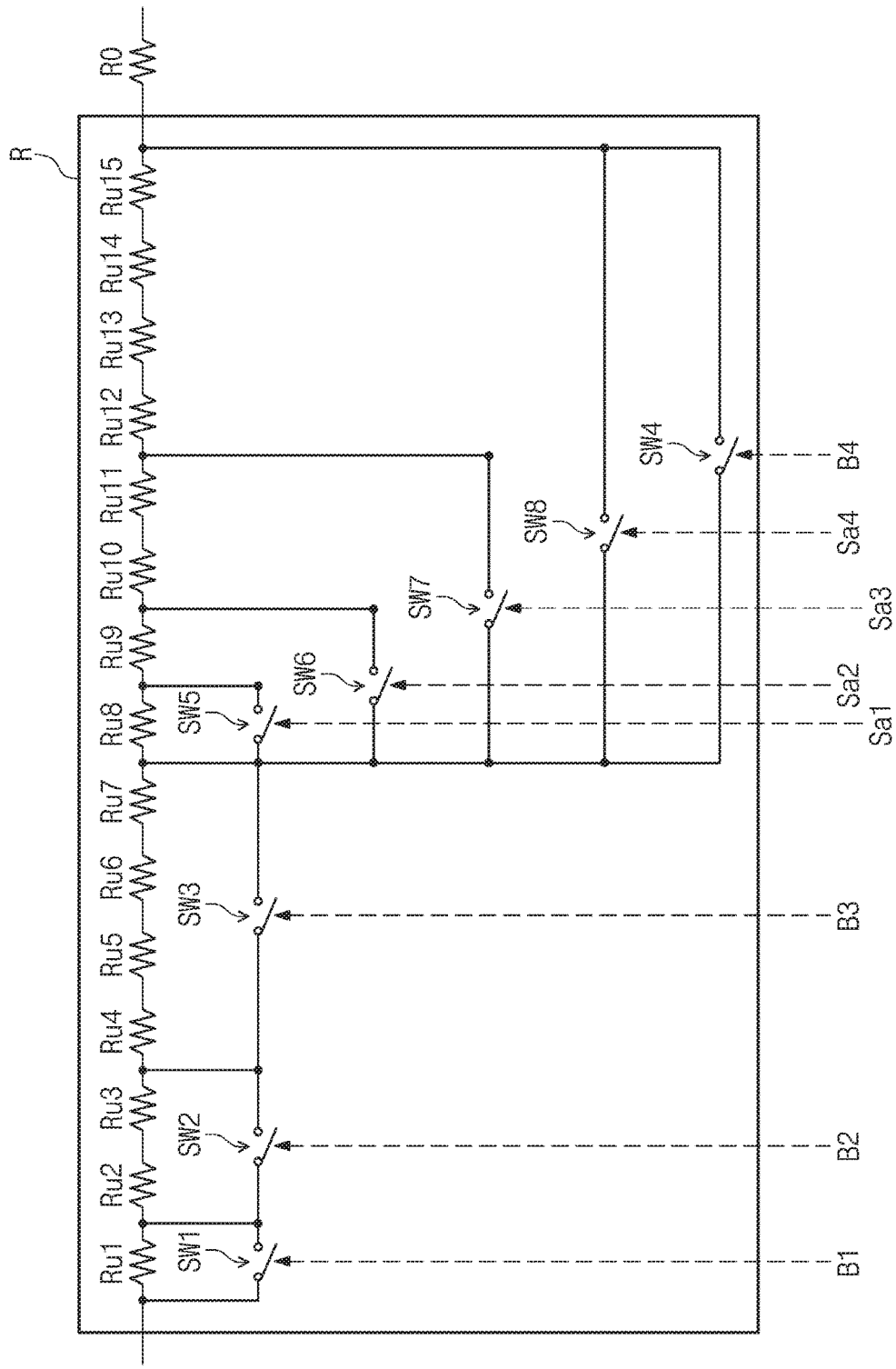
FIG. 10 illustrates one of a third variable resistor and a fourth variable resistor according to an example embodiment of the inventive concepts.

FIG. 10 illustrates one of a third variable resistor Rc and a fourth variable resistor Rd according to an example embodiment of the inventive concepts. An example where N is 4 is illustrated in FIG. 10. Referring to FIGS. 8 and 10, a variable R (e.g., the third or fourth variable resistor Rc or Rd) may include a plurality of resistors serially connected to a fixed resistor R0 (e.g., the third or fourth fixed resistor R0c or R0d). For example, the variable resistor R may include first through fifteenth resistors Ru1 to Ru15. The first through fifteenth resistors Ru1 to Ru15 may have the same resistance values.

The variable resistor R may further include first through eighth &witches SW1 to SW8. The variable resistor R may be controlled in the same manner of the variable resistor R1 of FIG. 9 except that the first through fourth switches SW1 to SW4 are controlled by the first control bits B[1:N] and the fifth through eighth switches SW5 to SW8 are controlled by the third control bits Sa[1:N]. Thus, an overlapping description is omitted.

A resistance value of the variable resistor R of FIG. 10 may be expressed by a mathematical formula 9.

$$R = Ru[B1 + 2B2 + 2^2B3 + B4(2^3 - \{Sa1 + 2Sa2 + 2^2Sa3 + 2^3Sa4\})] \quad \text{[mathematical formula 9]}$$

FIG. 11 illustrates fourth control bits Sb[1:N] according to first control bit values B[1:N] according to an example embodiment of the inventive concepts. Referring to FIGS. 9 and 11, when the first control bit values B[1:N] indicate '0000,' then the control value X may be '0', and the fourth control bits Sb[1:N] may have a value of '1000'. When the first control bit values B[1:N] indicate '0001,' then the control value X may be '1', and the fourth control bits Sb[1:N] may have a value of '0100'. When the first control bit values B[1:N] indicate '0010,' then the control value X may be '2', the fourth control bits Sb[1:N] may have a value of '0010'. When the first control bit values B[1:N] indicate '0011,' then the control value X may be '3', the fourth control bits Sb[1:N] may have a value of '0001'. In the case where the first control bit values B[1:N] indicate values except for the above values (e.g., '0000', '0001', '0010' and '0011'), the fourth control bits Sb[1:N] may have a value of '0000'. That is, when the first control bit values B[1:N] or the control value X indicated by the first control bit values B[1:N] has one of N (which is the number of bits of the first control bit values B[1:N]) lowest values, the fourth control bits Sb[1:N] may be used to reduce a resistance value of the variable resistor R1. When the first control bit values B[1:N] or the control value X indicated by the first control bit values B[1:N] does not have one of N (which is the number of bits of the first control bit values B[1:N]) lowest values, the fourth control bits Sb[1:N] may not have an effect on the resistance value of the variable resistor R1.

For example, when the first through fourth switches SW1 to SW4 are turned off, the eighth switch SW8 may be turned on and the fifth through seventh switches SW5 to SW7 may be turned off, thereby reducing a resistance value of the variable resistor R1. When the first switch SW1 is turned on and the second through fourth switches SW2 to SW4 are turned off, the seventh switch SW7 may be turned on and the fifth, sixth and eighth switches SW5, SW6, and SW8 may be turned off, thereby reducing a resistance value of the variable resistor R1. When the second switch SW2 is turned on and the first, third and fourth switches SW1, SW3, and SW4 are turned off, the sixth switch SW6 may be turned on and the fifth, seventh and eighth switches SW5, SW7, and SW8 may be turned off, thereby reducing a resistance value of the variable resistor R1. When the first and second switches SW1 and SW2 are turned on and the third and fourth switches SW3 and SW4 are turned off, the fifth switch SW5 may be turned on and the sixth through eighth switches SW6 to SW8 may be turned off, thereby reducing a resistance value of the variable resistor R1.

FIG. 12 illustrates third control bit values Sa[1:N] according to second control bit values $\overline{B[1:N]}$ according to an example embodiment of the inventive concepts. Referring to FIGS. 10 and 12, when the second control bit values $\overline{B[1:N]}$ indicate '0000,' then the control value X is '0', and the third control bit values Sa[1:N] may have a value of '1000'. When the second control bit values $\overline{B[1:N]}$ indicate '0001,' then the control value X is '1', and the third control bit values Sa[1:N] may have a value of '0100'. When the second control bit values $\overline{B[1:N]}$ indicate '0010,' then the control value X is '2', and the third control bit values Sa[1:N] may have a value of '0010'. When the second control bit values $\overline{B[1:N]}$ indicate '0011,' then the control value X is '3', the third control bit values Sa[1:N] may have a value of '0001'. In the case where the second control bit values $\overline{B[1:N]}$ indicate values except for the above values (e.g., '0000', '0001', '0010' and '0011'), the third control bit values Sa[1:N] may have a value of '0000'. That is, when the second control bit values $\overline{B[1:N]}$ or the control value X indicated by the second control bit values $\overline{B[1:N]}$ has one of N (which is the number of bits of first control bit values B[1:N]) number of lowest values, the third control bit values Sa[1:N] may be used to reduce a resistance value of the variable resistor R1. When the second control bit values $\overline{B[1:N]}$ or the control value X indicated by the second control bit values $\overline{B[1:N]}$ does not have one of N (which is the number of bits of second control bit values $\overline{B[1:N]}$) number of lowest values, the third control bit values Sa[1:N] may not have an effect on the resistance value of the variable resistor R1.

For example, when the first through fourth switches SW1 to SW4 are turned off, the eighth switch SW8 may be turned on and the fifth through seventh switches SW5 to SW7 may be turned off, thereby reducing a resistance value of the variable resistor R1. When the first switch SW1 is turned on and the second through fourth switches SW2 to SW4 are turned off, the seventh switch SW7 may be turned on and the fifth, sixth and eighth switches SW5, SW6, and SW8 may be turned off, thereby reducing a resistance value of the variable resistor R1. When the second switch SW2 is turned on and the first, third and fourth switches SW1, SW3, and SW4 are turned off, the sixth switch SW6 may be turned on and the fifth, seventh and eighth switches SW5, SW7, and SW8 may be turned off, thereby reducing a resistance value of the variable resistor R1. When the first and second switches SW1 and SW2 are turned on and the third and fourth switches SW3 and SW4 are turned off, the fifth switch SW5 may be turned on and the sixth through eighth switches SW6 to SW8 may be turned off, thereby reducing a resistance value of the variable resistor R1.

FIG. 13 illustrates a change of values of third and fourth control bits Sa[1:N] and Sb[1:N] and values of variable resistors R and R1 according to values of first control bits B[1:N] according to an example embodiment of the inventive concepts. An example where N is 4 and a resistance value of the resistor Ru is 1 is illustrated in FIG. 13.

Referring to FIGS. 8 through 13, when the first control bits B[1:N] have '0000' through '0011' (e.g., when the control value X has 0 through 3), the third control bits Sa[1:N] may have values of '1000', '0100', '0010', and '0001'. Thus, unlike those described with reference to FIG. 4, the variable resistor R1 may have values of '7', '10', '11', and '11' that are not sequentially reduced. When the control value X has values other than '0 through 3,' the third control bits Sa[1:N] may have a value of '0000'. Thus, when the control value X has values other than '0 through 3,' a resistance value of the variable resistor R1 may be the same as that described with reference to FIG. 4.

When the first control bits B[1:N] have '1100' through '1111' (e.g., when the control value X has 12 through 15), the fourth control bits Sb[1:N] may have values of '0001', '0010', '0100', and '1000'. Thus, unlike those described with reference to FIG. 4, the variable resistor R may have values of '11', '11', '10', and '7' that are not sequentially increased. When the control value X may have values except for '12 through 15,' the fourth control bits Sb[1:N] may have a value of '0000'. Thus, when the control value X has values except for '12 through 15,' a resistance value of the variable resistor R may be the same as that described with reference to FIG. 4.

As described with reference to FIG. 13, by further controlling the resistance values of the variable resistors R and R1 controlled using the third and fourth control bits Sa[1:N] and Sb[1:N], linear increase of the resistance values of the variable resistors R and R1 may be suppressed. This may cause linearity in a decibel unit to increase like the mathematical formula 1.

FIG. 14 illustrates resistance values X of variable resistors R and R1 and variable gains according to control values according to an example embodiment of the inventive concepts. In this example a resistance value of the fixed resistor R0 of FIGS. 9 and 10 may be the same as one of the first through fifteenth resistors Ru1 to Ru15 or may be half of a resistance value of one of the first through fifteenth resistors Ru1 to Ru15.

Referring to FIG. 14, when the control value X belongs an application range of the third and fourth control bits Sa[1:N] and Sb[1:N], that that is 0 through 3 or 12 through 15, an error Error[dB] less than the error Error[dB] illustrated in FIG. 5 occurs. A variable gain Av[dB] illustrated in FIG. 14 has a value closer to the ideal variable gain Avi[dB] as compared with the variable gain Av[dB] illustrated in FIG. 5. That is, the variable gain amplifier 100 described with reference to FIGS. 8 through 13 has an error less than the variable gain amplifier 10 described with reference to FIGS. 1 through 4 and has higher linearity in a decibel unit.

Figure 15:
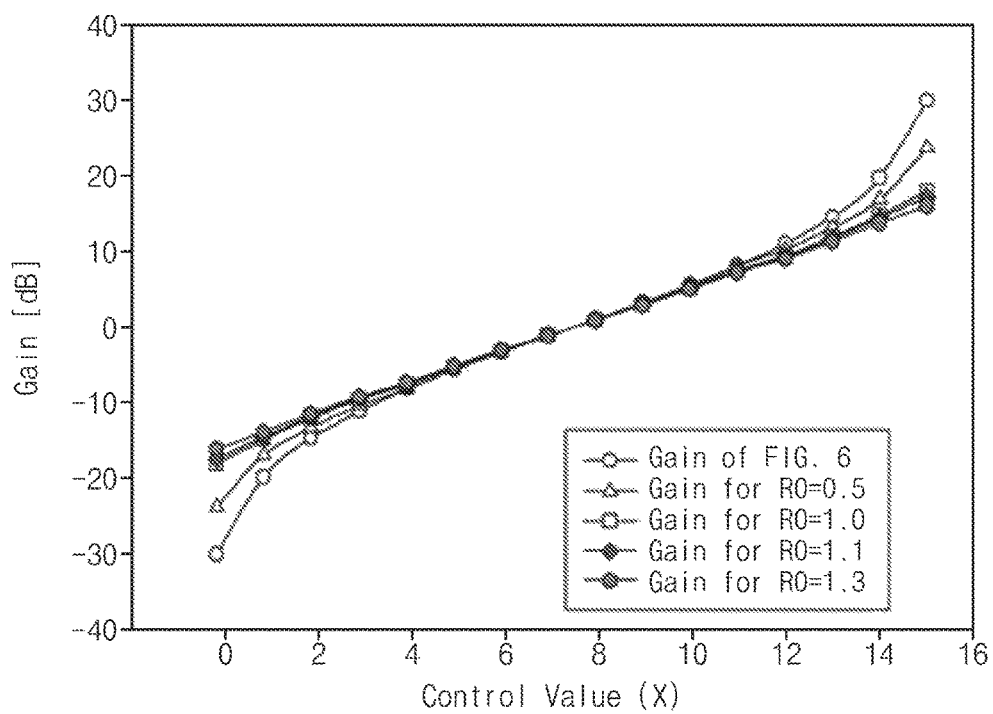
FIG. 15 is a graph illustrating a variable gain that changes according to a value of a fixed resistor according to an example embodiment of the inventive concepts.

FIG. 15 is a graph illustrating a variable gain Av[dB] that changes according to a value of a fixed resistor RU according to an example embodiment of the inventive concepts. In FIG. 15, a horizontal axis indicates a control value X and a vertical axis indicates a gain. In FIG. 15, a graph of the variable gain Av[dB] and the ideal variable gain Avi[dB] of FIG. 6 with respect to the control value X and a variable gain of the variable gain amplifier 100 of FIGS. 8 through 10 according to a change of the fixed resistor R0 is illustrated.

As illustrated in FIG. 15, as a ratio of the fixed resistor R0 to one or each of the first through fifteenth resistors Ru1 to Ru15 of the variable resistors R and R1 increases (e.g., the ratio increases in the order of 0.5, 1.0, 1.1 and 1.3), the linearity in decibel unit of the variable gain amplifier 100 may be further increased. Thus, a linear variable gain range of the variable gain amplifier 100 in a decibel unit may be extended.

Figure 16:
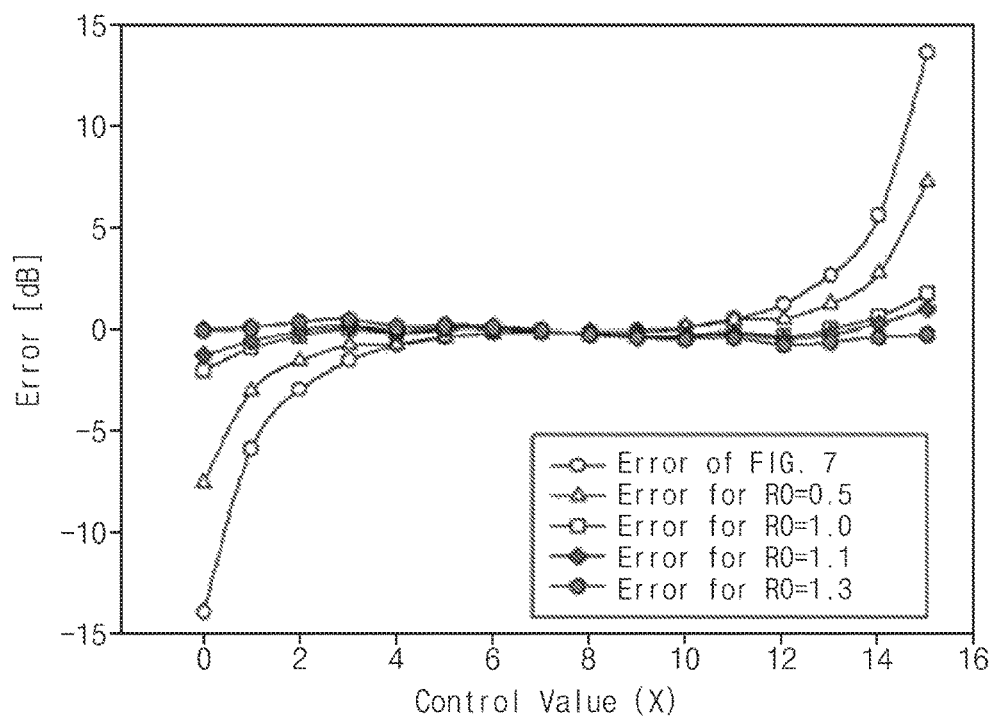
FIG. 16 is a graph illustrating an error that changes according to a value of a fixed resistor according to an example embodiment of the inventive concepts.

FIG. 16 is a graph illustrating an error Error[dB] that changes according to a value of a fixed resistor R0 according to an example embodiment of the inventive concepts. In FIG. 16, a horizontal axis indicates a control value X and a vertical axis indicates an error Error[dB]. In FIG. 16, a graph of an error of FIG. 7 with respect to the control value X and an error of the variable gain amplifier 100 of FIGS. 8 through 10 according to the fixed resistor R0 is illustrated.

As illustrated in FIG. 16, as a ratio of the fixed resistor R0 to one or each of the first through fifteenth resistors Ru1 to Ru15 of the variable resistors R and R1 increases (e.g., the ratio increases in the order of 0.5, 1.0, 1.1 and 1.3), the error Error [dB] of the variable gain amplifier 100 may be further reduced. Thus, a linear variable gain range of the variable gain amplifier 100 in a decibel unit may be extended.

According to example embodiments of the inventive concept, variable gain amplifiers having a wider linear variable gain range and/or methods of operating the same may be provided.

The contents described above are specific example embodiments for implementing the inventive concepts. The inventive concepts may include not only the example embodiments described above but also some example embodiments in which a design is modified or changed.

What is claimed is:

1. A variable gain amplifier comprising:
   an amplifier having a first input, a second input, a first output, and a second output;
   a first fixed resistor and a first variable resistor connected between the first input and a first input terminal;
   a second fixed resistor and a second variable resistor connected between the second input and a second input terminal;
   a third fixed resistor and a third variable resistor connected between the first input and the first output;
   a fourth fixed resistor and a fourth variable resistor connected between the second input and the second output;
   a first output terminal and a second output terminal connected to the first output and the second output, respectively; and
   a decoder configured to,
      receive first control bits,
      generate second control bits from the first control bits,
      generate third and fourth control bits from the first or second control bits, respectively,
      transmit the first control bits and the third control bits to the third and fourth variable resistors to adjust resistance values of the third and fourth variable resistors, and
      transmit the second and fourth control bits to the first and second variable resistors to adjust resistance values of the first and second variable resistors.

2. The variable gain amplifier of claim 1, wherein the decoder is configured to generate the second control bits by inverting the first control bits.

3. The variable gain amplifier of claim 1, wherein:
   the decoder is configured to adjust the resistance values of the third and fourth variable resistors based on the first control bits; and
   the decoder is configured to further reduce the resistance values of the third and fourth variable resistors based on the third control bits if the first control bits have one of N (N being a number of bits of the first control bits) lowest values from among values thereof.

4. The variable gain amplifier of claim 3, wherein the N is a number of bits of the first control bits.

5. The variable gain amplifier of claim 1, wherein the first through fourth control bits have a same number of bits.

6. The variable gain amplifier of claim 1, wherein
   each of the third and fourth variable resistors comprises a plurality of resistors serially connected to one another and a plurality of switches connected in parallel with the plurality of resistors;
   the decoder is configured to control a first switch, which is connected in parallel with a first resistor, based on a first bit of the first control bits;
   the decoder is configured to control a second switch, which is connected in parallel with second and third resistors, based on a second bit of the first control bits;
   the decoder is configured to control a third switch, which is connected in parallel with fourth through seventh resistors, based on a third bit of the first control bits; and
   the decoder is configured to control a fourth switch, which is connected in parallel with eighth and fifteenth resistors, based on a fourth bit of the first control bits.

7. The variable gain amplifier of claim 6, wherein
   the decoder is configured to control a fifth switch, which is connected in parallel with the eighth resistor, based on the first bit of the third control bits;
   the decoder is configured to control a sixth switch, which is connected in parallel with the eighth and ninth resistors, based on a second bit of the third control bits;

the decoder is configured to control a seventh switch, which is connected in parallel with the eighth through eleventh resistors, based on a third bit of the third control bits; and the decoder is configured to control an eighth switch, which is connected in parallel with the eighth and fifteenth resistors, based on a fourth bit of the third control bits.

8. The variable gain amplifier of claim 7, wherein the decoder is configured to turn on the eighth switch and turn off the fifth through seventh switches when turning off the first through fourth switches.

9. The variable gain amplifier of claim 7, wherein the decoder is configured to turn on the seventh switch and turn off the fifth, sixth and eighth switches when turning on the first switch and turning off the second through fourth switches.

10. The variable gain amplifier of claim 7, wherein the decoder is configured to turn on the sixth switch and turn off the fifth, seventh, and eighth switches when turning on the second switch and turning off the first, third and fourth switches.

11. The variable gain amplifier of claim 10, wherein the decoder is configured to turn on the fifth switch and turn off the sixth through eighth switches when turning on the first and second switches and turning off the third and fourth switches.

12. The variable gain amplifier of claim 6, wherein as a ratio of a resistance value of each of the first through fifteenth resistors to the first through fourth fixed resistors increases, decibel linearity of the variable gain amplifier increases.

13. The variable gain amplifier of claim 1, wherein the first through fourth variable resistors have a same structure.

14. The variable gain amplifier of claim 1, wherein the first through fourth fixed resistors have a same resistance value.

15. A method of operating a variable gain amplifier, the variable gain amplifier including first and second input terminals, first and second output terminals, an amplifier, first through fourth variable resistors, first and fourth fixed resistors, and a decoder, the amplifier having a first input, a second input, a first output, and a second output, the first fixed resistor and the first variable resistor connected between the first input and the first input terminal, the second fixed resistor and the second variable resistor connected between the second input and the second input terminal, the third fixed resistor and the third variable resistor connected between the first input and the first output, and the fourth fixed resistor and the fourth variable resistor connected between the second input and the second output, the method comprising:
receiving, by the decoder, a first control code;
generating, by the decoder, a second control code by inverting the first control code;
generating, by the decoder, a third control code that changes according to the first control code;
generating, by the decoder, a fourth control code that changes according to a value of the second control code;
adjusting, by the decoder, resistance values of the third and fourth variable resistors based on the first and third control codes; and adjusting, by the decoder, resistance values of the first and second variable resistors based on the second and fourth control codes.

16. A variable gain amplifier comprising:
an amplifier having a first input, a second input, a first output, and a second output;
a first fixed resistor and a first variable resistor serially connected between the first input and a first input terminal;
a second fixed resistor and a second variable resistor serially connected between the second input and a second input terminal;
a third fixed resistor and a third variable resistor serially connected between the first input and the first output;
a fourth fixed resistor and a fourth variable resistor serially connected between the second input and the second output;
the first output terminal and the second output terminal connected to the first output and the second output, respectively, each of the first, second, third, and fourth variable resistors including a plurality of resistors connected in series, a plurality of first switches running in parallel with the plurality of resistors, and a second plurality of second switches running in parallel with a subset of the plurality of resistors, each of the first and second switches connected in parallel with at least one of the plurality of resistors; and
a decoder configured to selectively turn-on or turn-off the first and second switches.

17. The variable gain amplifier of claim 16, wherein the decoder configured to,
receive first control bits,
generate second control bits based on the first control bits,
generate third and fourth control bits based on the first or second control bits, respectively,
transmit the first control bits and the third control bits to the third and fourth variable resistors to adjust resistance values of the third and fourth variable resistors, and
transmit the second and fourth control bits to the first and second variable resistors to adjust resistance values of the first and second variable resistors.

18. The variable gain amplifier of claim 17, wherein the decoder is configured to generate the second control bits by inverting the first control bits.

19. The variable gain amplifier of claim 16, wherein:
the decoder is configured to adjust the resistance values of the first and second variable resistors by controlling the first switches thereof based on the second control bits; and
the decoder is configured to further adjust the resistance values of the first and second variable resistors by controlling the second switches thereof based on the fourth control bits.

20. The variable gain amplifier of claim 16, wherein:
the decoder is configured to adjust the resistance values of the third and fourth variable resistors by controlling the first switches thereof based on the first control bits; and
the decoder is configured to further adjust the resistance values of the third and fourth variable resistors by controlling the second switches thereof based on the third control bits.

* * * * *